US012068396B2

(12) United States Patent
Wang et al.

(10) Patent No.: US 12,068,396 B2
(45) Date of Patent: Aug. 20, 2024

(54) PARASITIC CAPACITANCE REDUCTION

(71) Applicant: Taiwan Semiconductor Manufacturing Co., Ltd., Hsinchu (TW)

(72) Inventors: Jia-Heng Wang, Hsinchu (TW); Chun-Han Chen, Changhua County (TW); I-Wen Wu, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/357,307

(22) Filed: Jul. 24, 2023

(65) Prior Publication Data
US 2023/0402531 A1    Dec. 14, 2023

Related U.S. Application Data

(62) Division of application No. 17/717,777, filed on Apr. 11, 2022, now Pat. No. 11,757,022, which is a
(Continued)

(51) Int. Cl.
*H01L 29/76*    (2006.01)
*H01L 21/3213*    (2006.01)
(Continued)

(52) U.S. Cl.
CPC .. *H01L 29/66795* (2013.01); *H01L 21/32136* (2013.01); *H01L 21/823431* (2013.01); *H01L 29/0653* (2013.01); *H01L 29/7851* (2013.01)

(58) Field of Classification Search
CPC ......... H01L 29/66795; H01L 21/32136; H01L 21/823431; H01L 29/0653; H01L 29/7851;
(Continued)

(56) References Cited

U.S. PATENT DOCUMENTS 9,548,366 B1    1/2017 Ho et al.
9,831,183 B2 *    11/2017 Lin ....................... H01L 23/485
(Continued)

FOREIGN PATENT DOCUMENTS

TW    201841303 A    11/2018
TW    201919236 A    5/2019
TW    202004859 A    1/2020

*Primary Examiner* — Theresa T Doan
(74) *Attorney, Agent, or Firm* — HAYNES AND BOONE, LLP

(57) ABSTRACT

The present disclosure provides semiconductor devices and methods of forming the same. A semiconductor device according to one embodiment of the present disclosure includes a first fin-shaped structure extending lengthwise along a first direction over a substrate, a first epitaxial feature over a source/drain region of the first fin-shaped structure, a gate structure disposed over a channel region of the first fin-shaped structure and extending along a second direction perpendicular to the first direction, and a source/drain contact over the first epitaxial feature. The bottom surface of the gate structure is closer to the substrate than a bottom surface of the source/drain contact.

20 Claims, 12 Drawing Sheets

Related U.S. Application Data division of application No. 17/085,032, filed on Oct. 30, 2020, now Pat. No. 11,302,802.

(60) Provisional application No. 62/978,593, filed on Feb. 19, 2020.

(51) Int. Cl.
*H01L 21/8234* (2006.01)
*H01L 29/06* (2006.01)
*H01L 29/66* (2006.01)
*H01L 29/78* (2006.01)
*H01L 29/94* (2006.01)

(58) Field of Classification Search
CPC ............... H01L 27/0886; H01L 29/785; H01L 21/823475; H01L 21/823821; H01L 21/823871; H01L 27/0924
USPC ........................................................ 257/288
See application file for complete search history.

(56) References Cited

U.S. PATENT DOCUMENTS

| | | | |
|---|---|---|---|
| 10,297,690 B2 * | 5/2019 | Li | .................. H01L 21/823821 |
| 10,504,990 B2 | 12/2019 | Wu et al. | |
| 10,679,903 B2 | 6/2020 | Lin | |
| 10,727,226 B2 | 7/2020 | Chen | |
| 2017/0053804 A1 | 2/2017 | Lu et al. | |

* cited by examiner

PARASITIC CAPACITANCE REDUCTION

PRIORITY DATA

This is a divisional application of U.S. patent application Ser. No. 17/717,777, filed Apr. 11, 2022, which is a divisional application of U.S. patent application Ser. No. 17/085,032, filed Oct. 30, 2020, which claims priority to U.S. Provisional Patent Application No. 62/978,593 filed on Feb. 19, 2020, entitled "PARASITIC CAPACITANCE REDUCTION", each of which is hereby incorporated herein by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. The channel region of the MBC transistor may be formed from nanowires, nanosheets, other nanostructures, and/or other suitable structures.

As the dielectric layers between a gate structure and a source/drain contact of a multi-gate device become thinner, parasitic capacitance between the gate structure and the source/drain contact may impact device performance. For example, in some conventional technologies, over-etching is performed to form a source/drain contact opening that extends well into an isolation feature between active regions and a source/drain contact is formed into the source/drain contact opening. A lateral overlap between such a source/drain contact and an adjacent gate structure may have undesirable parasitic capacitance. Therefore, although conventional source/drain contact and formation processes are generally adequate for their intended purposes, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
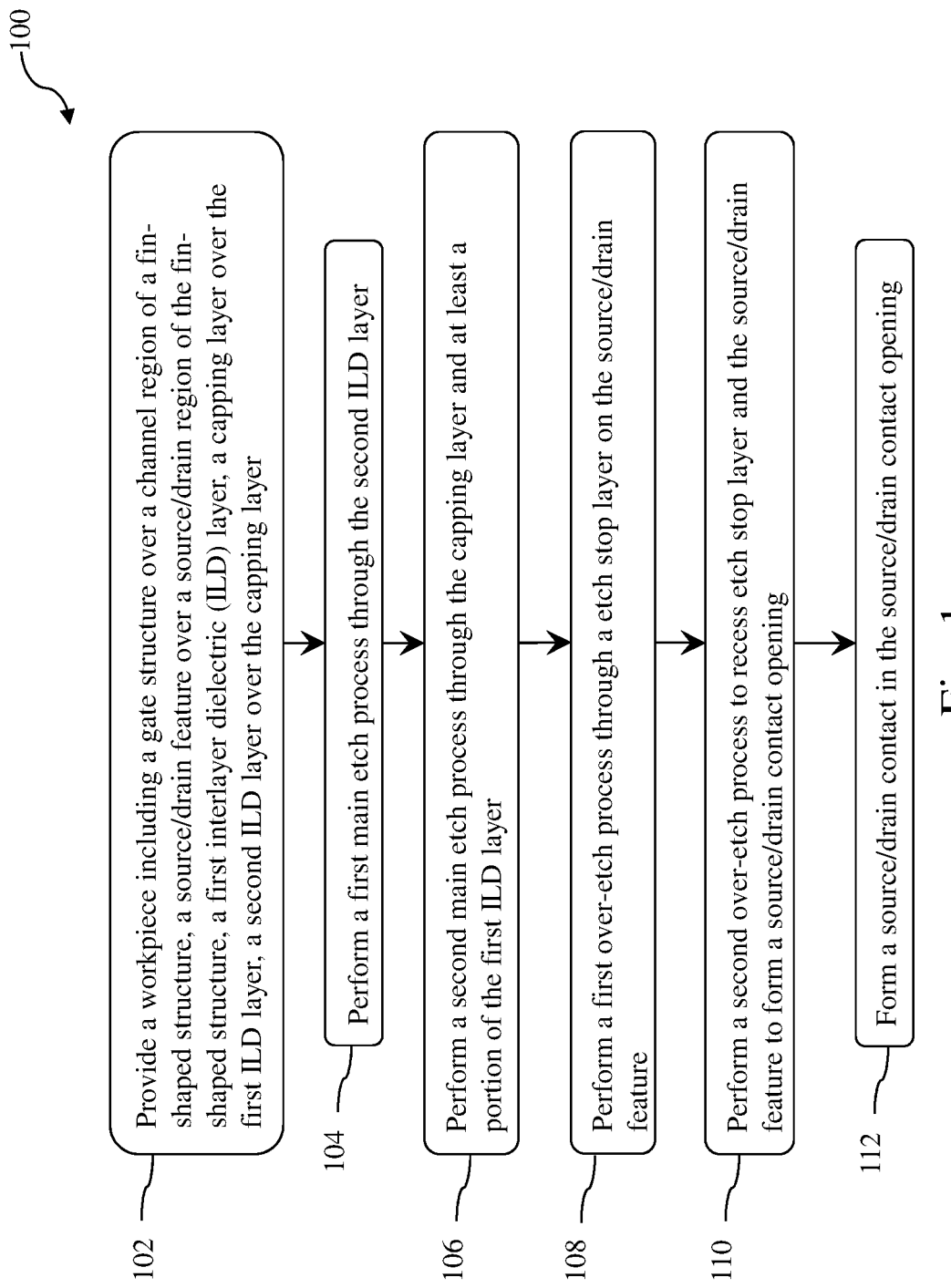
FIG. 1 is a flow chart of a method of fabricating a semiconductor device, according to various aspects of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

As IC devices shrink in size, short channel effects (SCEs) have prevented further scaling down of planar field effect transistors (FETs). Various multi-gate devices with improved short channel effect control emerged over the years, facilitating the continuing scaling down of semiconductor devices to even smaller device nodes and higher device density. Examples of multi-gate devices include a fin-shape field effect transistor (FinFET) and a multi-bridge channel (MBC) FET. Although the scaling down is made possible by multi-gate devices, conductive structures in multi-gate devices may be separated by thin dielectric layers, resulting in increased parasitic resistance and parasitic capacitance. The parasitic capacitance between conductive structures increases with their dimensions and decrease with distance separating them. For example, when forming a FinFET, a source/drain feature in a source/drain region of a fin structure is recessed to form a source/drain opening, which is to be filled with conductive materials for forming a source/drain contact. In some conventional techniques, the recessing of the source/drain region may etch too much below the source/drain feature and unnecessarily increase the depth of the source/drain opening. The increased depth may lead to increased parasitic capacitance. The present disclosure provides a method of forming a source/drain contact that does not extend below a bottommost level of a gate structure. By reducing the depth of the source/drain contact, parasitic capacitance between the source/drain contact and the adjacent gate structure is reduced.

The various aspects of the present disclosure will now be described in more detail with reference to the figures. FIG. 1 is a flow chart of a method 100 for fabricating a semiconductor device according to various aspects of the present disclosure. Method 100 is merely an example and is not intended to limit the present disclosure to what is explicitly illustrated in method 100. Additional steps can be provided before, during, and after method 100, and some of the steps described can be moved, replaced, or eliminated for additional embodiments of method 100. Not all steps are described herein in detail for reasons of simplicity. Method 100 will be described below in conjunction with the top view of the workpiece 200 in FIG. 2 and fragmentary cross-sectional views of the same in FIGS. 3-12. Referring to FIGS. 1, 2, 3, and 4, method 100 includes a block 102 where a workpiece 200 is provided. The workpiece 200 may be an intermediate device fabricated during processing of an IC, or a portion thereof, that may include static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. Additional features can be added in semiconductor devices fabricated on the workpiece 200, and some of the features described below can be replaced, modified, or eliminated in other embodiments of the semiconductor device to be fabricated on the workpiece 200. Because a semiconductor device is to be formed from the workpiece 200 at the conclusion of the processes described in the present disclosure, the workpiece 200 may be referred to as a semiconductor device 200 as the context requires.

Figure 2:
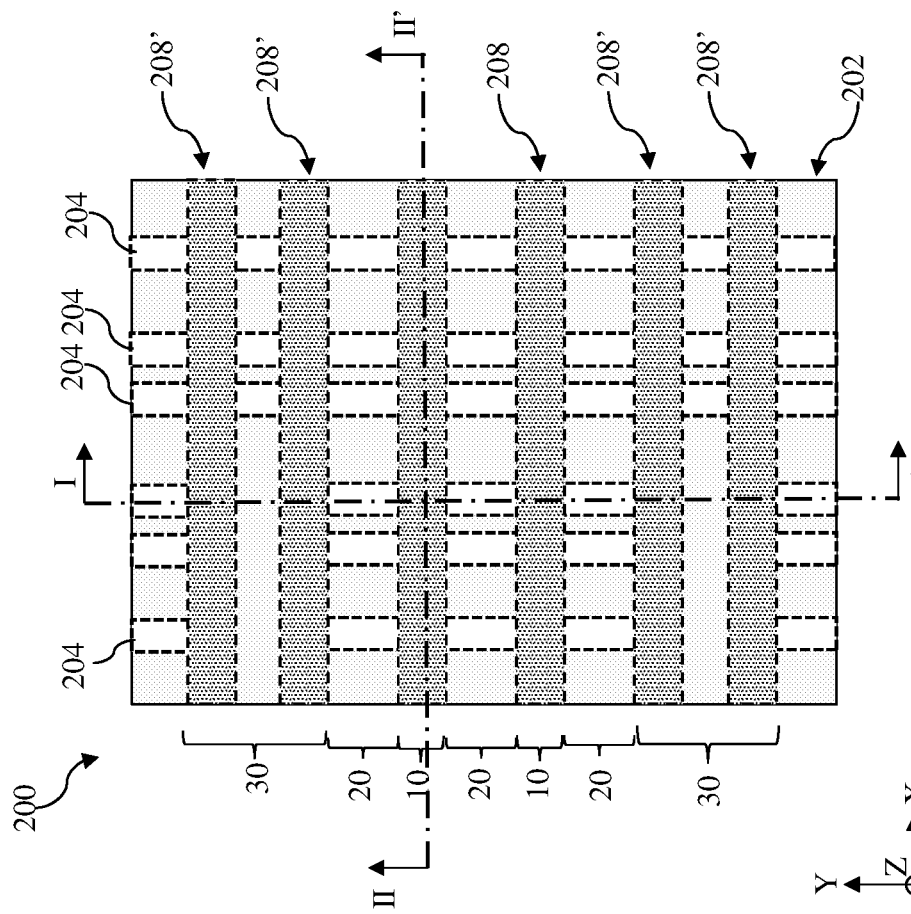
FIG. 2 is a fragmentary top-view of a workpiece at a fabrication stage, such as one associated with the method in FIG. 1, according to various aspects of the present disclosure.
Figure 3:
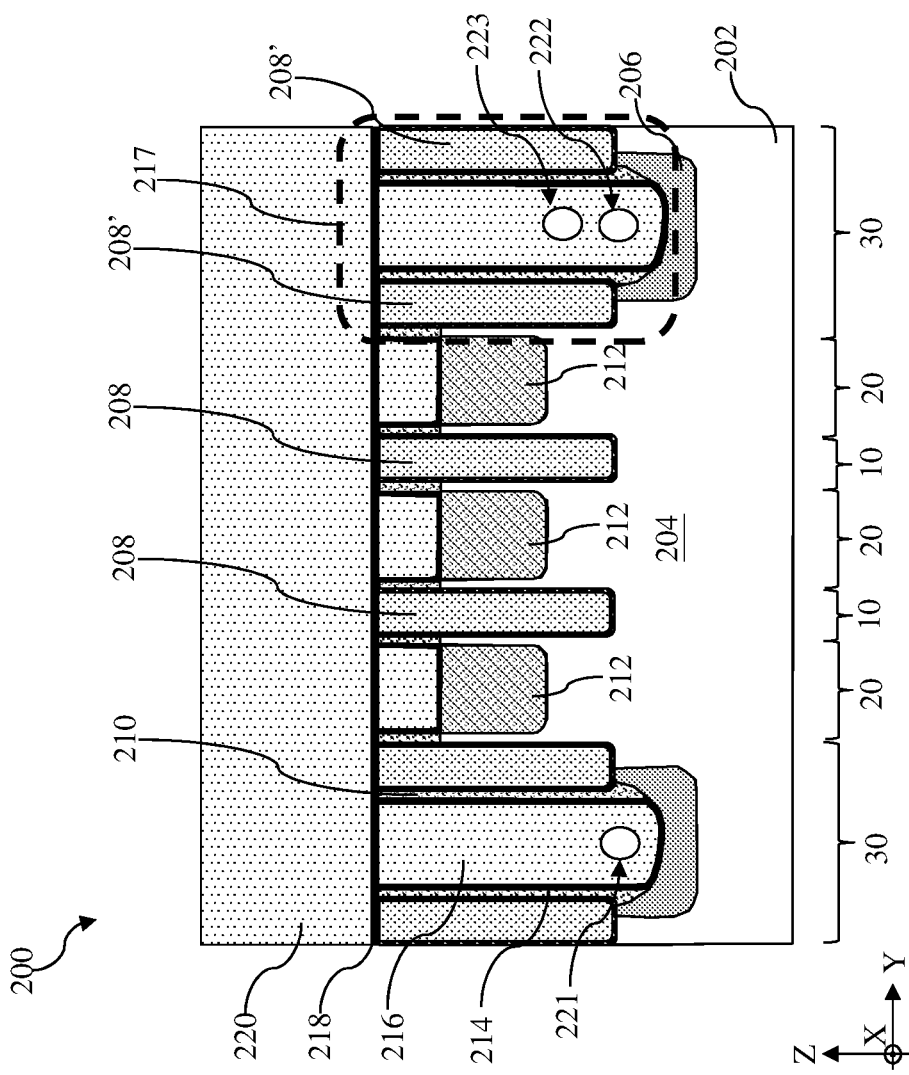
FIGS. 3-12 are fragmentary cross-sectional view of a workpiece at various fabrication stages, such as those associated with the method in FIG. 1, according to various aspects of the present disclosure.
Figure 4:
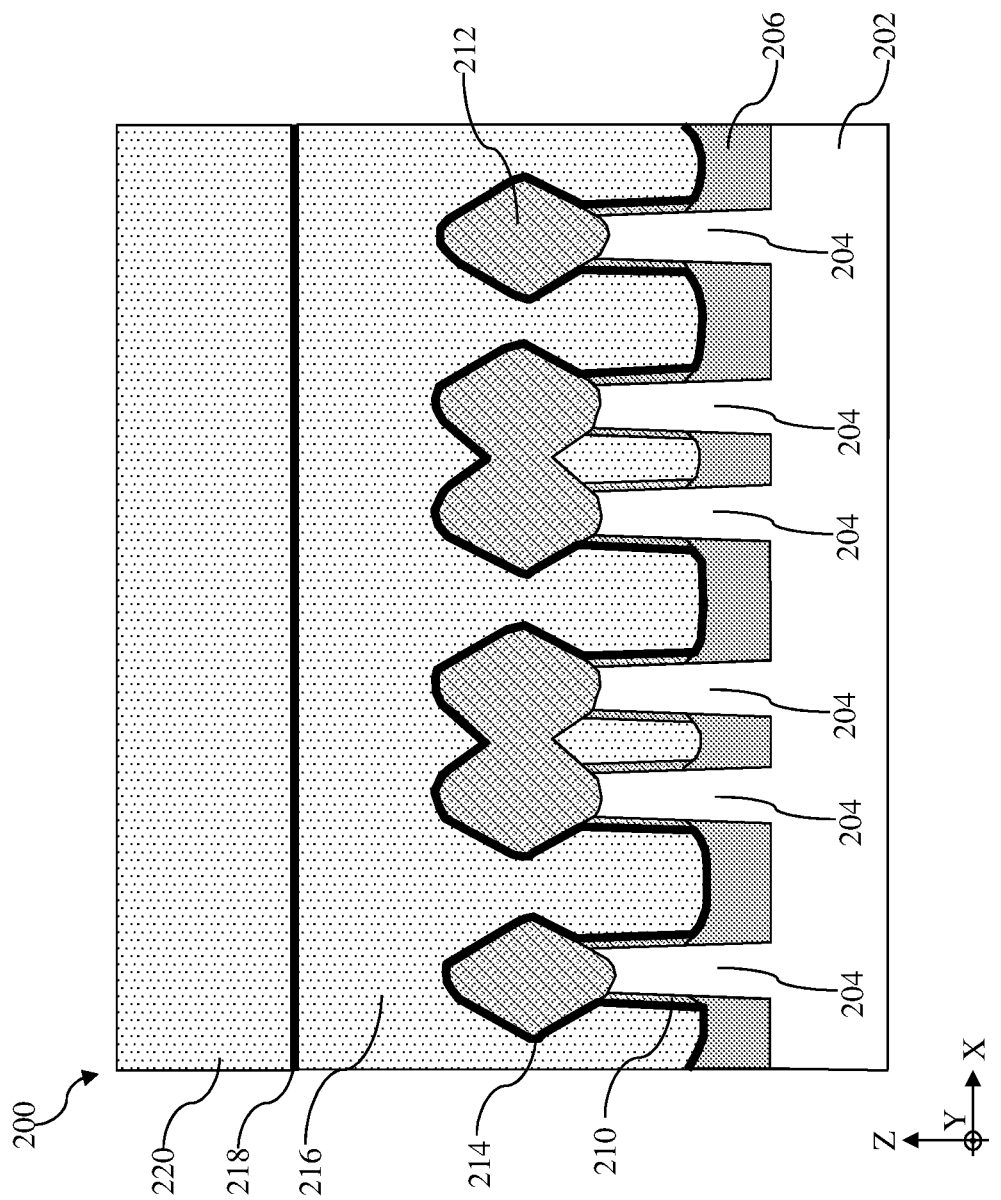

Reference is first made to FIG. 2, which is a fragmentary top view of the workpiece 200. For simplicity of illustration, FIG. 2 illustrates the orientations, regions, and relative positions of a substrate 202, fin-shaped structures 204, gate structures 208, and isolation gate structures 208'. FIG. 3 as well as FIG. 12 illustrate a fragmentary cross-sectional view along the I-I' cross-section along the lengthwise direction of a fin-shaped structure 204, which extends along the Y direction. FIG. 4, as well as FIGS. 5-11 illustrate a fragmentary cross-sectional view along the II-II' cross-section along the lengthwise direction of a gate structure 208, which extends along the X direction. In the depicted embodiments, the workpiece 200 includes a substrate 202. The substrate 202 may be a bulk substrate that includes silicon. Alternatively, in some implementations, substrate 202 include a bulk substrate (including, for example, silicon) and one or more material layers disposed over the bulk substrate. For example, the one or more material layers may include a semiconductor layer stack having various semiconductor layers (such as a heterostructure) disposed over the bulk substrate, where the semiconductor layer stack is subsequently patterned to form fin-shape structures. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b$ from bottom to top, where a, c are different atomic percentages of silicon and b, d are different atomic percentages of germanium). Alternatively or additionally, the bulk substrate 202 and/or the one or more material layers include another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-V materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The fin-shaped structure 204 may be formed from the substrate 202 or semiconductor layers deposited over the substrate 202 using a multiple-patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using, for example, a self-aligned process. Then, the patterned sacrificial layer is removed, and the spacers can be used to pattern an underlying layer. In some implementations, directed self-assembly (DSA) techniques are implemented during the multiple patterning processes. In the depicted embodiments, there may be multiple fin-shaped structures 204 on the substrate 202. As described above, the fin-shaped structure 204 may either be formed of a uniform semiconductor composition when the semiconductor device 200 includes FinFETs or include a stack of alternating semiconductor layers when the semiconductor device 200 includes MBCFETs. As shown in FIGS. 3 and 4, the fin-shaped structures 204 are isolated from one another by an isolation feature 206, which may be a shallow trench isolation (STI) feature.

As illustrated in FIG. 2, the fin-shaped structure 204 extend lengthwise along the Y direction and the gate structures 208 extend lengthwise along the X direction over channel regions 10 of the fin-shaped structures 204. Each of the channel regions 10 is sandwiched between two source/drain regions 20 along the Y direction. In some embodiments represented in FIG. 1 as well as other figures of the present disclosure, the workpiece 200 includes isolation regions 30. Each of the isolation regions 30 divides the fin-shaped structure 204 into different segments and represents a form of a fin cut feature. Referring to FIG. 3, an isolation structure 217 may be present in the isolation region 30 to separate one fin-shaped structure 204 from another fin-shaped structure that is aligned with the fin-shaped structure 204 along the Y direction. Referring to FIGS. 2 and 3, the isolation structure 217 may be two isolation gate structures 208' each of which is disposed over an edge of a fin-shaped structure 204. The two isolation gate structures 208' may sandwich dielectric layers disposed between two isolation gate structures 208'. The isolation gate structures 208' may have a structure similar to that of gate structures 208. The difference lies primarily in location and functionality. While the gate structures 208 in the channel regions 10 are functional, the isolation gate structure 208' in the isolation regions 30 provide fin-shaped structure isolation but do not perform circuit functions.

The isolation structure 217 may be formed using various different processes. The resulting structure may be shown in FIG. 3. In an example process, fin cut trenches along the X direction are formed to divide one or more fin-shaped structures 204 into segments. An isolation dielectric material, such as silicon oxide, silicon nitride, silicon oxynitride, is deposited over the workpiece 200, including into the recesses and trenches among fin-shaped structures 204. The deposited isolation dielectric material is then planarized, such as by a chemical mechanical polishing (CMP), and then etched back to form the isolation features 206. In some instances, the isolation feature 206 may be a shallow trench isolation (STI) feature and may be referred to as such. As shown in FIG. 3, the isolation feature 206 may be present between fin-shaped structure segments of a fin-shaped structure 204. FIG. 4 illustrates that the isolation feature 206 may also be disposed between two parallel fin-shaped structures 204. After the formation the isolation feature 206, dummy gate stacks (not shown) are formed over the channel regions 10 of the fin-shaped structures 204 as placeholders for the gate structures 208 and isolation gate structure 208'. In some instances, the dummy gate stacks may include a dummy gate dielectric layer formed of silicon oxide and a dummy gate electrode formed of polysilicon. For patterning purposes, the dummy gate stacks may also include one or more gate-top hard mask layers that are formed of silicon nitride, silicon oxide, or both. A gate spacer layer 210 is then deposited over the workpiece 200, including over sidewalls of the dummy gate stacks. When the gate-top hard mask layer is present, the gate spacer layer 210 may be deposited over a top surface of the gate-top hard mask layer. The gate spacer layer 210 may be a single layer or a multi-layer. In some implementations, the gate spacer layer may be formed of silicon oxide, silicon nitride, silicon oxynitride, silicon oxycarbonitride, silicon carbonitride, or silicon carbide. Using the gate top hard mask layer and the gate spacer layer 210 as an etch mask, the source/drain regions 20 of the fin-shaped structures 204 are recessed to form source/drain recesses. Epitaxial deposition processes are then used to form source/drain features 212 in the source/drain recesses. The source/drain features 212 may include a semiconductor material doped with a dopant. In some instances, the source/drain feature 212 may include boron doped silicon germanium (SiGeB) for p-type devices or phosphorus doped silicon (SiP) for n-type devices. After the formation of the source/drain features 212, the ESL 214 and the first dielectric layer 216 are sequentially deposited over the workpiece 200, including over the source/drain features 212 and the dummy gate stacks. The workpiece 200 is planarized or recessed to expose top surfaces of the dummy gate stacks on a planar top surface. At this point, the process replaces the dummy gate stacks with the gate structures 208 or isolation gate structures 208'. After workpiece 200 is planarized again to remove excess materials, a capping layer 218 is deposited over the exposed top surfaces of the gate structures 208 and isolation gate structures 208'. A second dielectric layer 220 is then deposited over the capping layer 218.

In some embodiments where the first dielectric layer 216 is deposited using CVD or spin-on coating, one or more air gaps or voids may be formed in the first dielectric layer 216 when a width of the fin cut trench or fin-to-fin spacing along the Y direction continues to decrease. In the embodiments represented in FIG. 3, a first air gap 221, a second air gap 222, and a third air gap 223 may be formed in the first dielectric layer 216. The first air gap 221 represents a lone air gap in the first dielectric layer while the second and third air gaps 222 and 223 represent vertically spaced-apart air gaps.

Referring to FIG. 4, the ESL 214 is deposited conformally over surfaces of the source/drain features 212 to control the etch process to form source/drain contact opening exposing the source/drain features 212. In this regard, the ESL 214 may also be referred to as a contact etch stop layer (CESL) 214. As shown in FIG. 4, the ESL 214 is not only deposited over the source/drain features 212 but is also deposited over top surfaces of the isolation features 206 among fin-shaped structures 204 (or segments of fin-shaped structures 204). The first dielectric layer 216 may be referred to as the first interlayer dielectric (ILD) layer 216 and the second dielectric layer 220 may be referred to as the second interlayer dielectric (ILD) layer 220. The first dielectric layer 216 and the second dielectric layer 220 may be formed of the same dielectric material. In some implementations, the first dielectric layer 216 and the second dielectric layer 220 may include a dielectric material including, for example, silicon oxide, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. The capping layer 218 may also be referred to as a gate top capping layer 218. In some implementations, the capping layer 218 is formed of an oxygen-free (or oxygen-atom free) dielectric material, such as silicon nitride. The capping layer 218 functions to prevent the gate structures 208 from being oxidized due to diffusion of oxygen atoms from overlying dielectric layers, such as the second dielectric layer 220.

Figure 5:
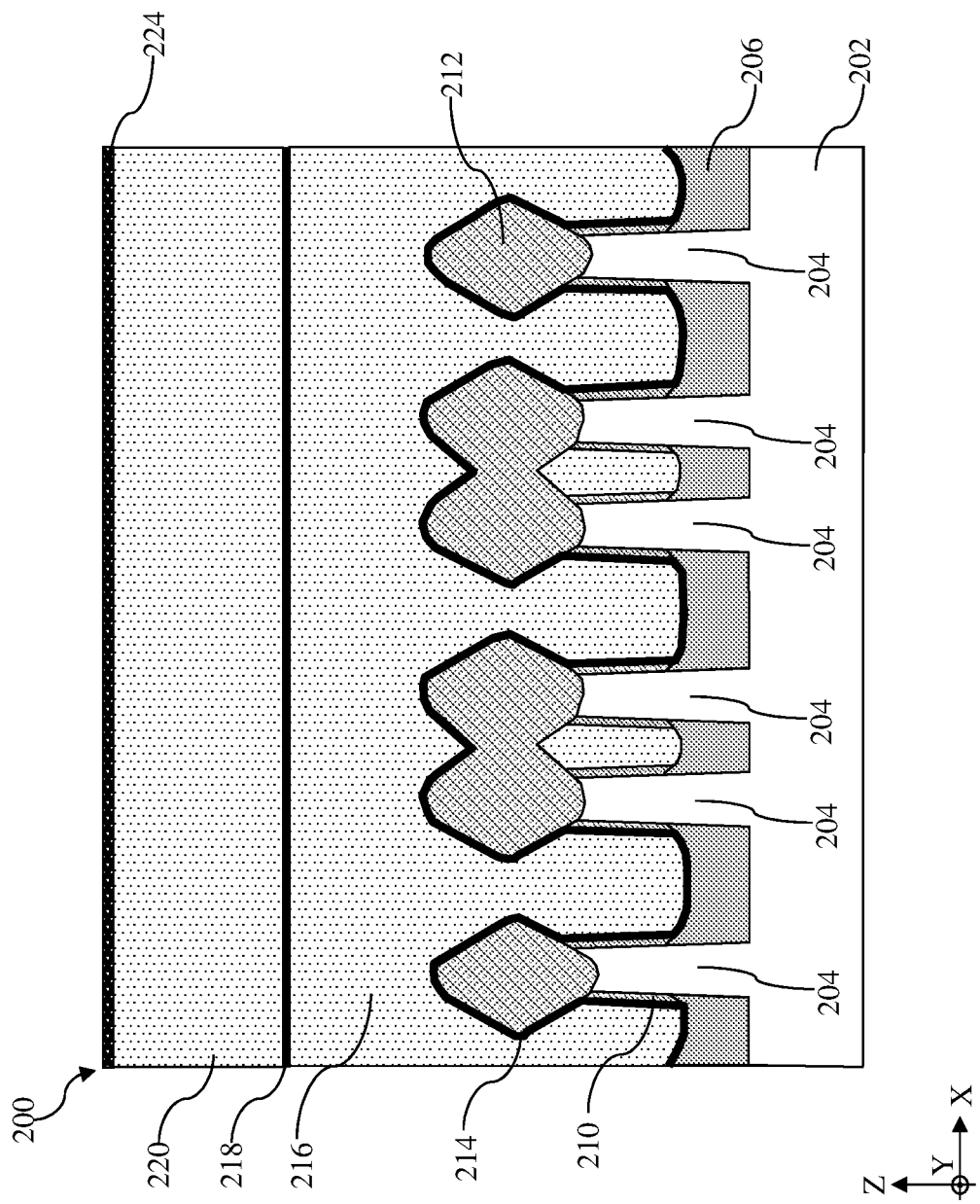
Figure 6:
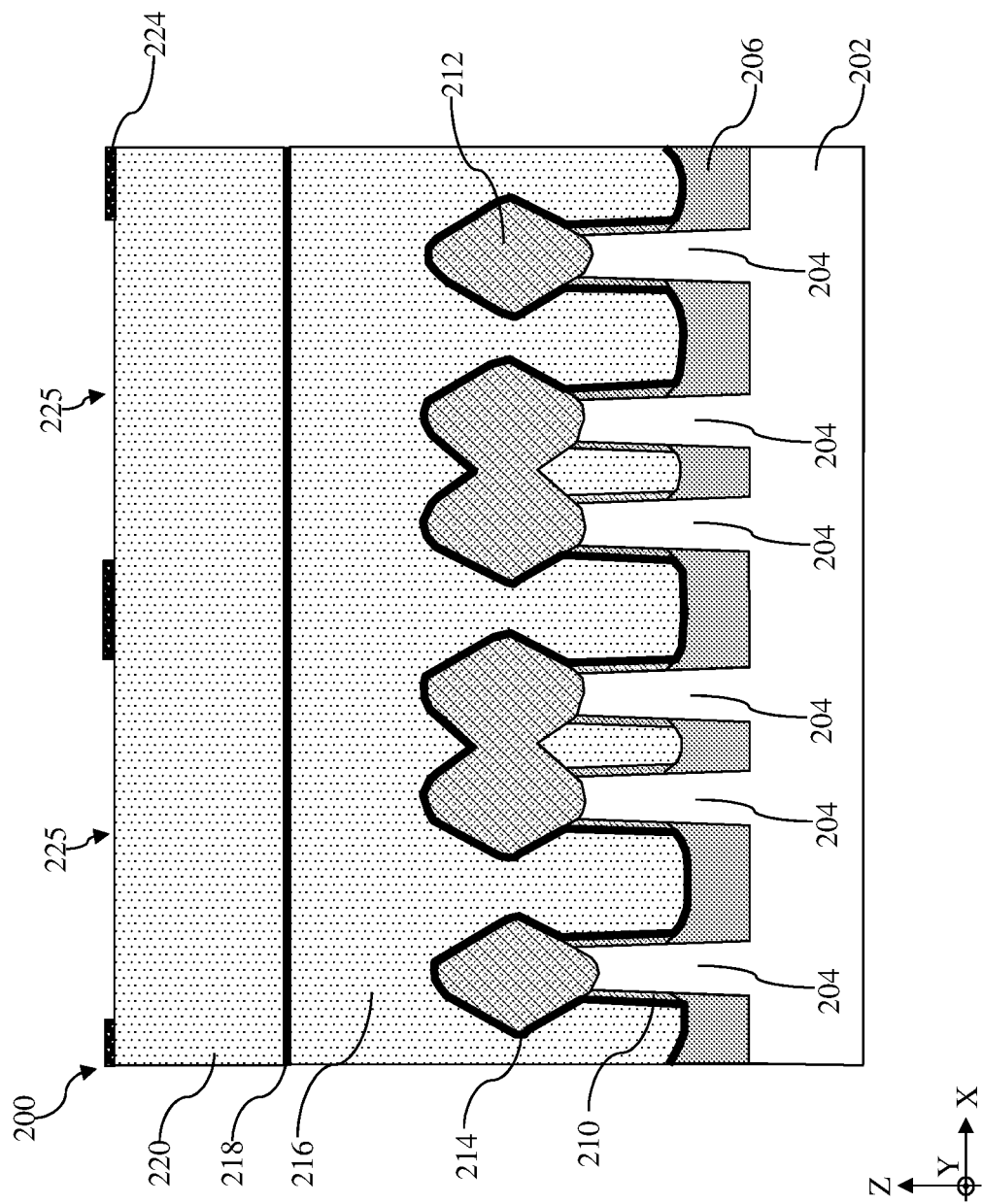

Referring to FIGS. 1, 5, 6, and 7, method 100 includes a block 104 where a first main etch process 300 is performed to etch through a portion of the second dielectric layer 220. Referring to FIG. 5, in order to form an etch mask for the first main etch process 300 and subsequent etch processes, a mask layer 224 is deposited over the workpiece 200. In some embodiments, the mask layer 224 is formed of a material that may endure various etch processes of the present disclosure. In some implementations, the mask layer 224 is formed of tungsten carbide, titanium carbide, zirconium oxide, or aluminum oxide. In one example, the mask layer 224 is formed of tungsten carbide. The mask layer 224 is then patterned using photolithography and etch processes. In an example process, a photoresist layer is deposited over the mask layer 224. The photoresist layer is then exposed to a patterned radiation transmitting through or reflected from a photo mask, baked in a post-exposure bake process, developed in a developer solution, and then rinsed, thereby forming a patterned photoresist layer. The patterned photoresist layer is then applied as an etch mask to etch the underlying mask layer 224, thereby patterning the same as shown in FIG. 6. In the embodiments illustrated in FIG. 6, the patterned mask layer 224 includes mask openings 225, each of which is disposed directly over a plurality of source/drain features 212.

Figure 7:
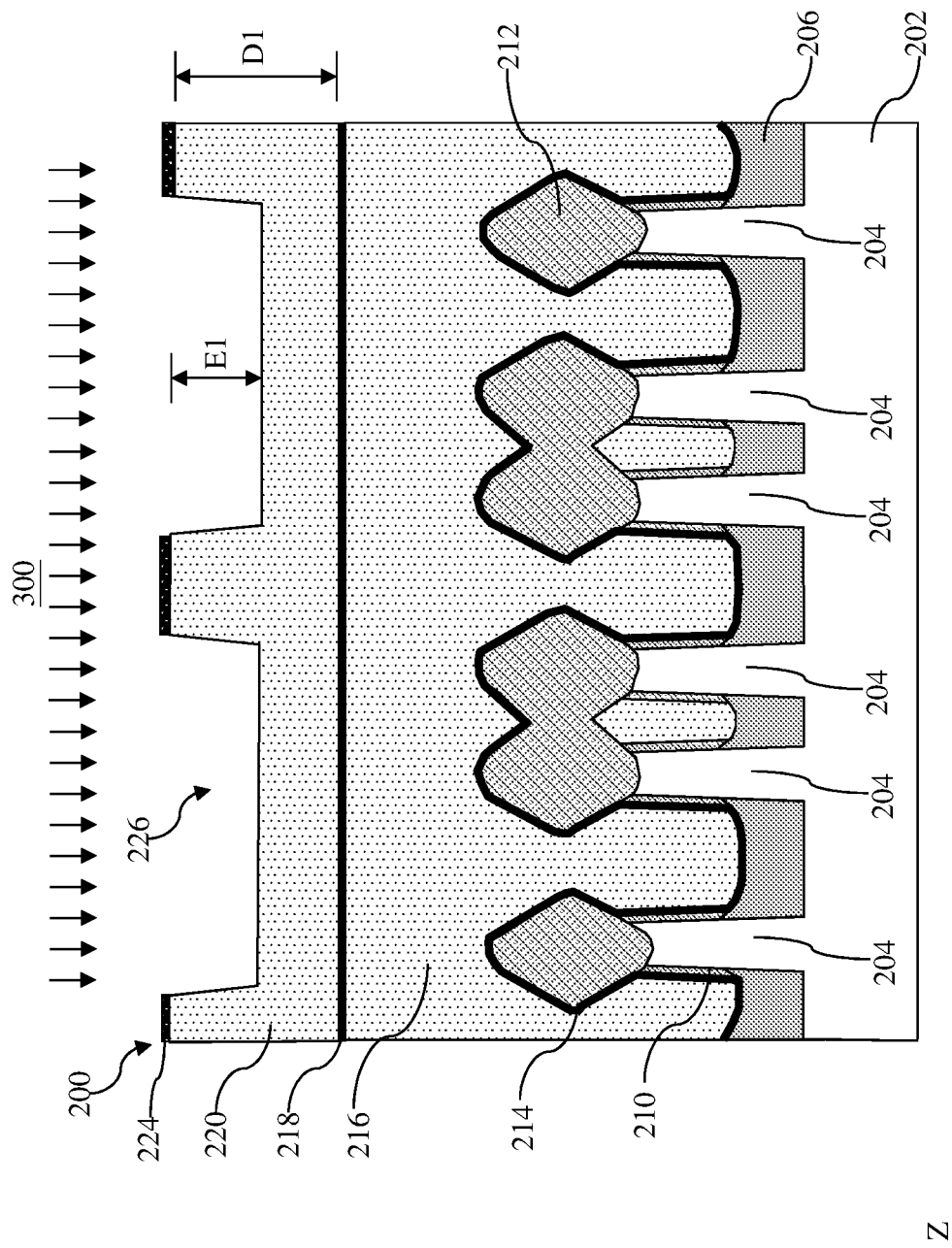

Referring now to FIG. 7, with the patterned mask layer 224 acting as an etch mask, the first main etch process 300 is performed. In the depicted embodiments, the first main etch process 300 etches through only the second dielectric layer 220 and is timed to stop before the capping layer 218 is etched. In some embodiments, the second dielectric layer 220 may have a first thickness D1 along the Z direction, where the first thickness D1 is between about 55 nm and about 75 nm. The first main etch process 300 may etch a first depth E1 into the second dielectric layer 220. The first depth E1 is smaller than the thickness D1. In embodiments where the second dielectric layer 220 is formed substantially of silicon oxide, the etchant or etchants for first main etch process 300 are selected such that the first main etch process 300 is selective to silicon oxide. In some embodiments, the first main etch process 300 may include a dry etch process using halogen containing or oxygen containing etchants. For example, the first main etch process 300 may include a fluorine-containing etchant (for example, $CF_4$, $SF_6$, $NF_3$, $CH_2F_2$, $CHF_3$, and/or $C_2F_6$), an oxygen-containing etchant, a chlorine-containing etchant (for example, $Cl_2$, $CHCl_3$, $CCl_4$, and/or $BCl_3$), a bromine-containing etchant (for example, HBr and/or $CHBR_3$), an iodine-containing etchant, other suitable etchant (which can be used to generate an etchant gas and/or etching plasma), or combinations thereof. In one example, the first main etch process 300 includes a fluorine-containing etchant (for example, $CF_4$, $SF_6$, $NF_3$, $CH_2F_2$, $CHF_3$, and/or $C_2F_6$). In an alternative embodiment, the first main etch process 300 may include a wet etch process that uses dilute hydrofluoric acid (DHF) solution. Upon conclusion of the operations at block 104, first openings 226 are formed in the second dielectric layer 220. Because the first main etch process 300 stops before it reaches the capping layer 218, the capping layer 218 is not exposed in the first openings 226.

Figure 8:
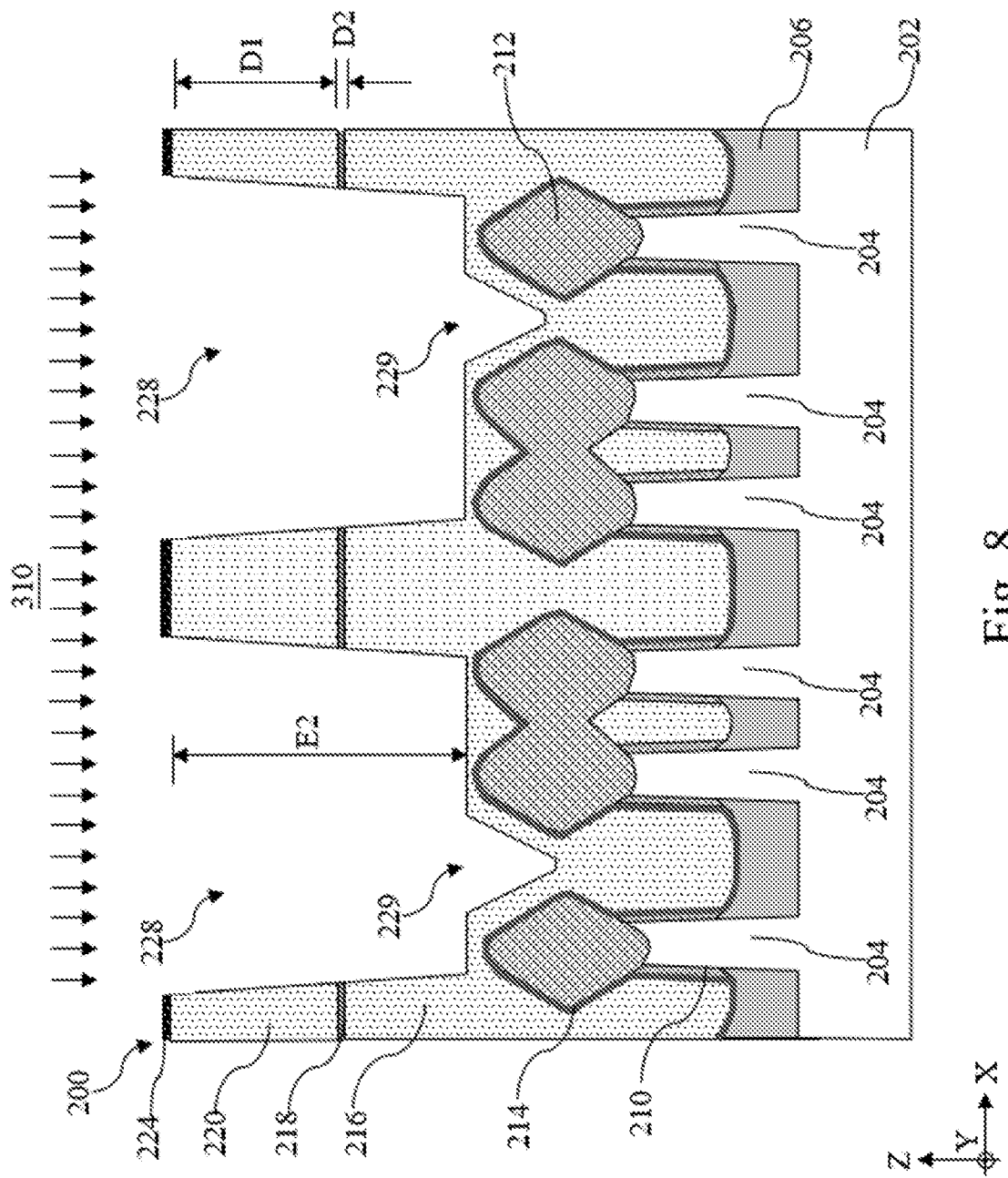

Referring to FIGS. 1 and 8, method 100 includes a block 106 where a second main etch process 310 is performed to etch through the capping layer 218 and at least a portion of the first dielectric layer 216. With the patterned mask layer 224 continuing to serve as the etch mask, the second main etch process 310 is performed to extend the first openings 226 (shown in FIG. 7) through the capping layer 218 to form the second openings 228. As shown in FIG. 8, the second main etch process 310 etches through the rest of the first thickness D1 (i.e., the difference between D1 and E1) of the second dielectric layer 220 exposed in the mask opening 225, the entire second thickness D2 of the capping layer 218, and partially into the first dielectric layer 216. In FIG. 8, each of the second openings 228 has a second depth E2. As the second depth E2 is greater than a sum of the first thickness D1 and the second thickness D2, the second depth E2 is also greater than the first depth E1. In some implementations, the second thickness D2 may be between about 3 nm and 10 nm and the second depth E2 may be between 80 nm and about 120 nm. In some embodiments represented in FIG. 8, the second main etch process 310 may form a bottom recess 229 at a bottom surface of the second opening 228. As illustrated in FIG. 8, the bottom recess 229 may extend downward between two adjacent source/drain features 212.

From top to bottom, the second main etch process 310 etches through the rest of the second dielectric layer 220, the capping layer 218, and a portion of the first dielectric layer 216. In some embodiments, the second main etch process 310 stops before or at the ESL 214. FIG. 8 illustrates embodiments where the second main etch process 310 stops before the ESL 214 is etched. As the first dielectric layer 216 and the second dielectric layer 220 may be formed substantially of silicon oxide and the capping layer 218 may be formed of an oxygen-free dielectric material (such as silicon nitride), etchants of the second main etch process 310 are selected to etch both. The second main etch process 310 may include a suitable dry etch process or a suitable wet etch process. In embodiments where the second main etch process 310 includes a dry etch process, the second main etch process 310 may include use of a fluorine-containing etchant (for example, $CF_4$, $SF_6$, $NF_3$, $CH_2F_2$, $CHF_3$, and/or $C_2F_6$) as well as a nitrogen-containing reagent, such as nitrogen gas ($N_2$) or ammonia ($NH_3$). It has been observed that the presence of the nitrogen-containing reagent may increase the etch rate of silicon nitride while slowing down the etch rate for silicon oxide. In embodiments where the second main etch process 310 includes a wet etch process, the second main etch process 310 may include use of dilute hydrofluoric acid (DHF) solution as well as a buffering agent, such as ammonium fluoride ($NH_4F$). A mixture of DHF and a buffering agent may be referred to as a buffered hydrofluoric acid (BHF) solution. The BHF solution etches both silicon oxide and silicon nitride, albeit at a slower rate than does DHF.

In some embodiments, the second main etch process 310 may be a single-stage process. In these embodiments, the second main etch process 310 may be a single-stage dry etch process using a fluorine-containing etchant and a nitrogen-containing reagent or a single-stage wet etch process using a BHF solution. In some alternative embodiments, the second main etch process 310 may be a multi-stage process, such as a dual-stage process. In an example dual-stage process, the second main etch process 310 includes a first stage that etches through the capping layer 218 and a subsequent second stage that is selective to the first dielectric layer 216. In that example, the first stage is less selective to silicon oxide than the second stage of the second main etch process 310. Put different, the first stage is not selective such that it etches both the second dielectric layer 220, which may be formed of silicon oxide, and the capping layer 218, which may be formed of silicon nitride. The second stage is selective to silicon oxide such that the second stage etches the first dielectric layer 216 and substantially stops or slows down when the ESL 214 is reached. When the dual-stage second main etch process 310 includes dry etch processes, the first stage includes more nitrogen containing reagent (greater partial pressure in gas phase) than the second stage, or the first stage includes the nitrogen-containing reagent while the second stage is free of the nitrogen-containing reagent. When the dual-stage second main etch process 310 includes wet etch processes, the first stage includes more buffering agent (greater concentration in the etchant solution) than the second stage, or the first stage uses BHF as the etchant while the second stage uses DHF as the etchant.

Figure 9:
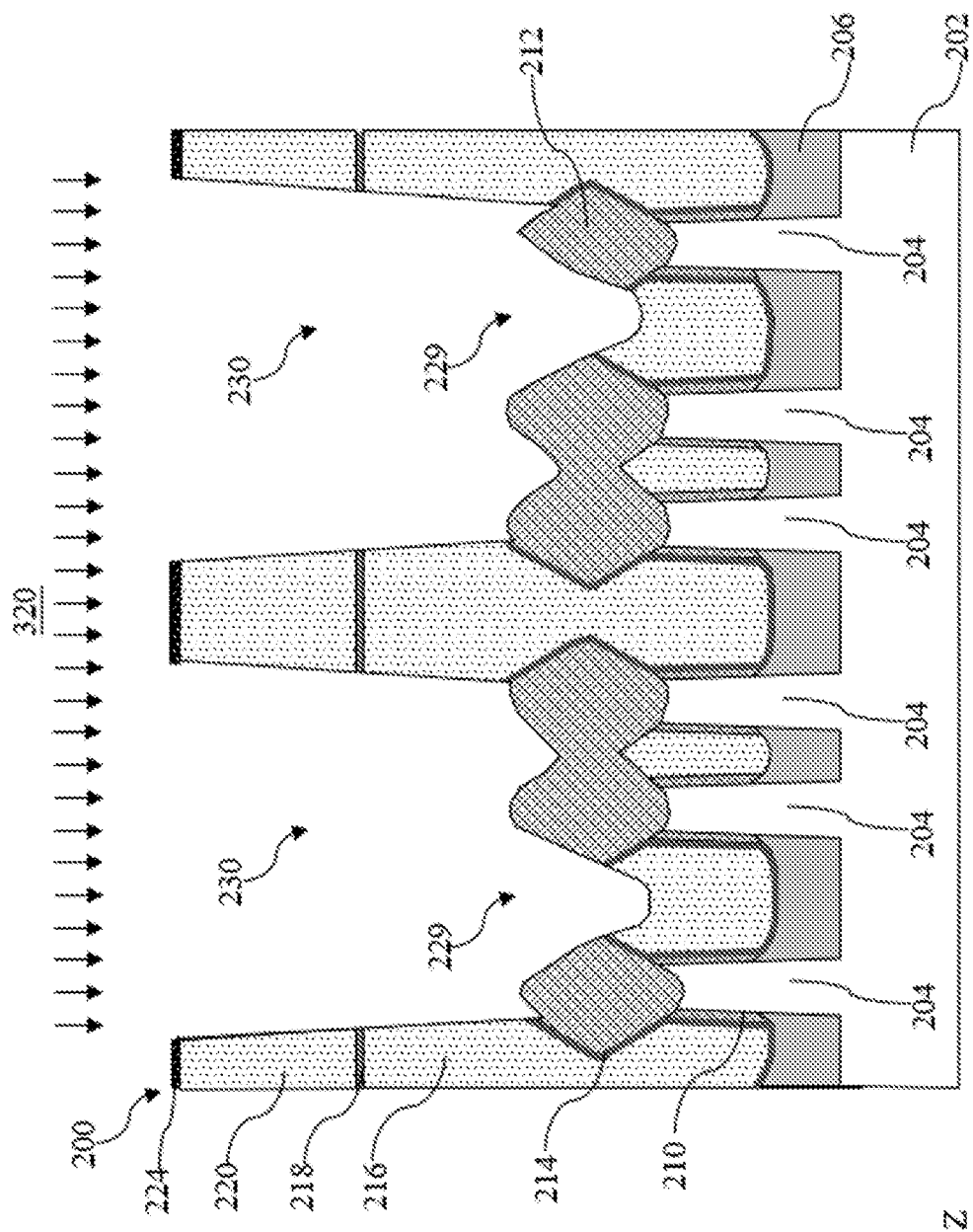

Referring to FIGS. 1 and 9, method 100 includes a block 108 where a first over-etch process 320 is performed to etch through the etch stop layer 214 on the source/drain feature 212. With the patterned mask layer 224 remaining as the etch mask, the first over-etch process 320 selectively etches the etch stop layer 214 without substantially extending the bottom recess 229 further into the first dielectric layer 216. Upon conclusion of the operations at block 108, the ESL 214 that is exposed in the second openings 228 in FIG. 8 is removed to form third openings 230. The first over-etch process 320 may be a dry etch process or a wet etch process. In embodiments where the first over-etch process 320 is a dry etch process, the first over-etch process 320 may include use of a fluorine-containing etchant (for example, $CF_4$, $SF_6$, $NF_3$, $CH_2F_2$, $CHF_3$, and/or $C_2F_6$) as well as a nitrogen-containing reagent, such as nitrogen gas ($N_2$) or ammonia ($NH_3$). As described above, the presence of the nitrogen-contain reagent may increase the etch selectivity with respect to the ESL 214, which may be formed of silicon nitride. In embodiments where the first over-etch process 320 is a wet etch process, the first over-etch process 320 may include use of a phosphoric acid ($H_3PO_4$) solution. Such a wet etch process is isotropic but is highly selective with respect to the ESL 214, which may be formed of silicon nitride.

Figure 10:
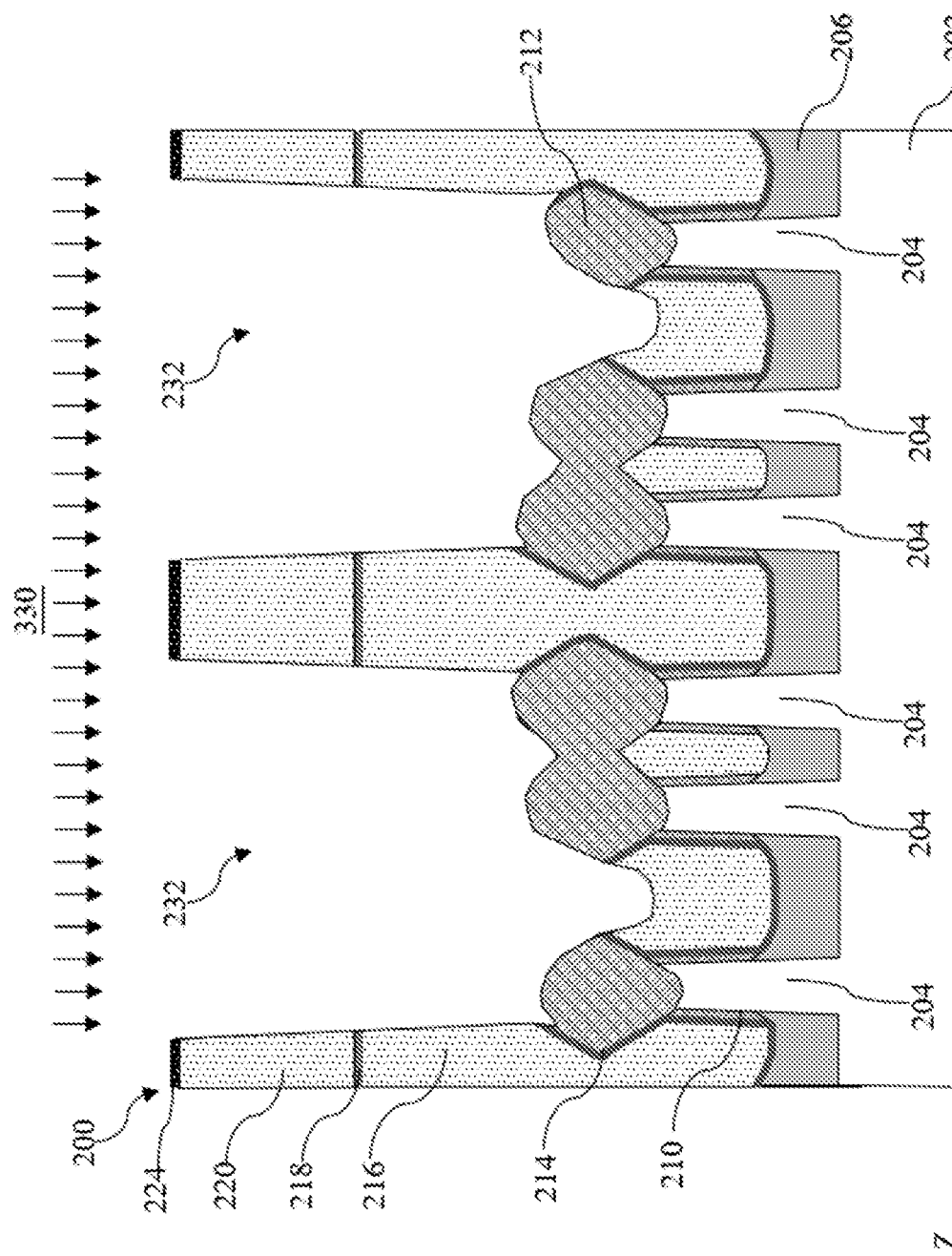

Referring to FIGS. 1 and 10, method 100 includes a block 110 where a second over-etch process 330 is performed to recess the etch stop layer 214 and the source/drain feature 212 to form a source/drain contact opening 232. For operations at block 110, the patterned mask layer 224 remains as an etch mask. The second over-etch process 330 further etches back the ESL 214, the first dielectric layer 216, and the source/drain feature 212. For that reason, the second over-etch process 330 may be regarded as a trimming or a cleaning process that further expands the third openings 230 to source/drain contact openings 232. As compared to the third openings 230, the source/drain contact openings 232 expose additional surfaces of the source/drain features 212. Because the second over-etch process 330 etches layers formed of different dielectric materials, it is not made selective to the ESL 214. Therefore, the first over-etch process 320 has a first etch selectivity with respect to the ESL 214 or silicon nitride and the second over-etch process 330 has a second etch selectivity with respect to the ESL 214 or silicon nitride. The first etch selectivity is greater than the second etch selectivity. The second over-etch process 330 may be a dry etch process or a wet etch process. In embodiments where the second over-etch process 330 is a dry etch process, the second over-etch process 330 may include use of a fluorine-containing etchant (for example, $CF_4$, $SF_6$, $NF_3$, $CH_2F_2$, $CHF_3$, and/or $C_2F_6$) as well as a nitrogen-containing reagent, such as nitrogen gas ($N_2$) or ammonia ($NH_3$). As compared to the first over-etch process, the second over-etch process 330 may include less or a lower partial pressure of the nitrogen-containing reagent. In embodiments where the second over-etch process 330 is a wet etch process, the second over-etch process 330 may include use of BHF. Compared to DHF, BHF etches both silicon oxide and silicon nitride at a slower rate. The slower etch rate of BHF prevents the second over-etch process 330 from etching too much into the space between neighboring source/drain features 212. Upon conclusion of operations of block 110, source/drain contact openings 232 are substantially formed.

Figure 11:
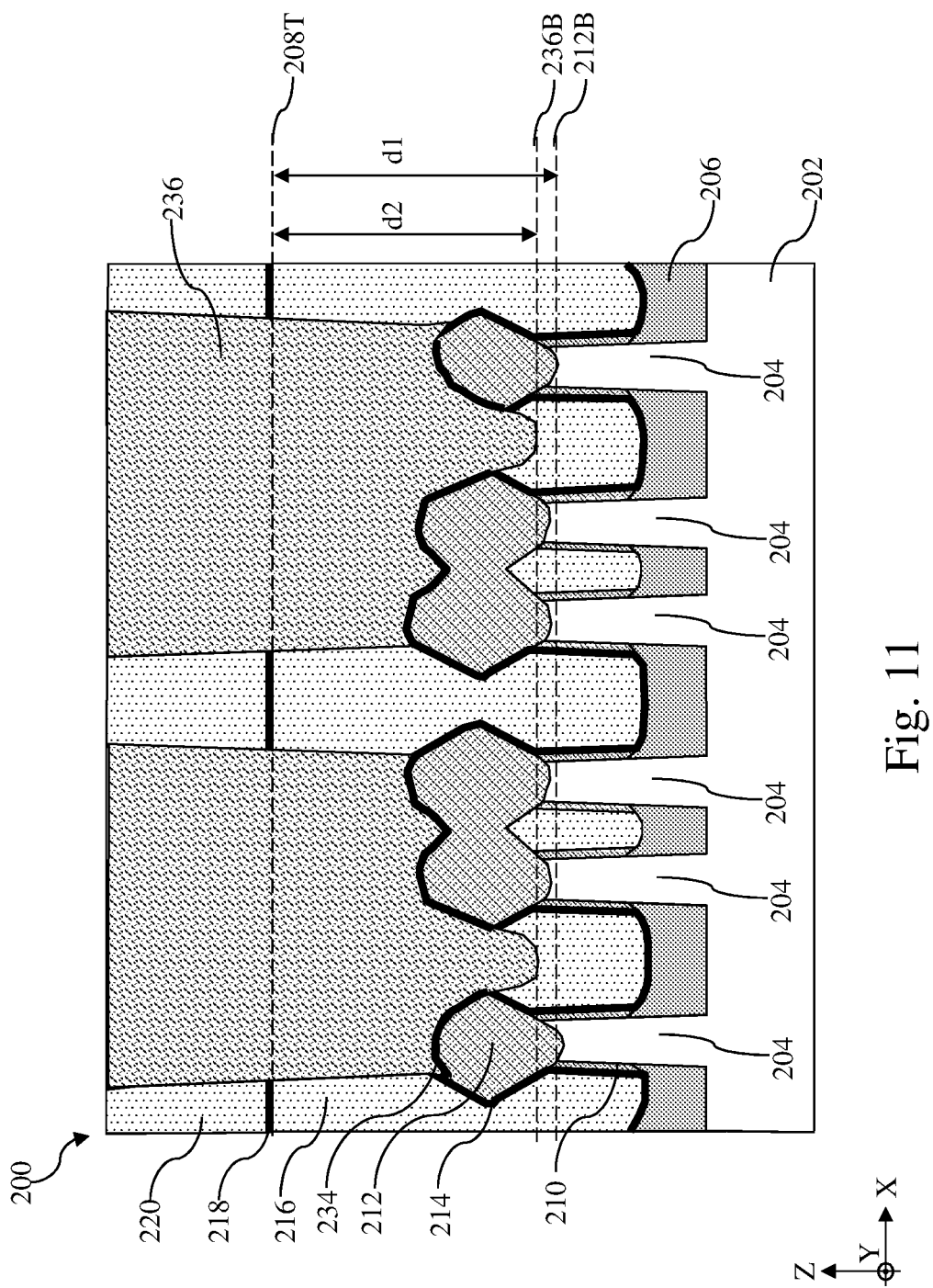
Figure 12:
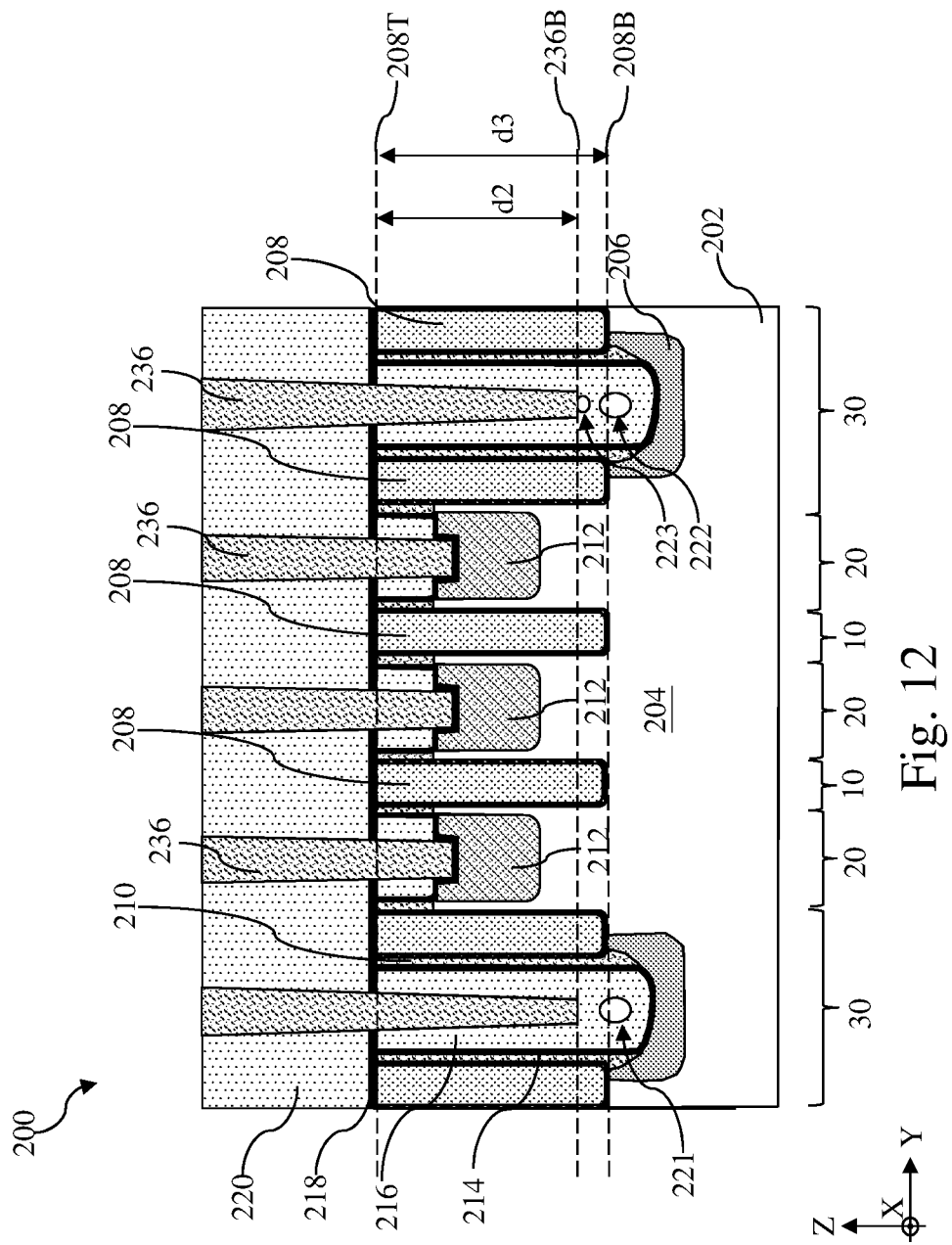

Referring to FIGS. 1, 11 and 12, method 100 includes a block 112 where a source/drain contact 236 is formed in the source/drain contact opening 232. In some embodiments, before the source/drain contact 236 is formed, a silicide feature 234 is formed over the exposed surfaces of the source/drain feature 212 by depositing a metal material over the source/drain feature 212 and annealing the workpiece 200 to bring about a silicidation reaction between the metal material and the source/drain feature 212. In some instances, the metal material may include titanium (Ti), nickel (Ni), cobalt (Co), tantalum (Ta), or tungsten (W) and the silicide feature 234 may include titanium silicide, nickel silicide, cobalt silicide, tantalum silicide, tungsten silicide. The silicide feature 234 functions to reduce contact resistance. After the formation of the silicide feature 234, source/drain contacts 236 are deposited in the source/drain contact openings 232. Each of the source/drain contacts 236 may be formed of a metal selected from copper (Cu), tungsten (W), aluminum (Al), cobalt (Co), ruthenium (Ru), nickel (Ni), other suitable materials, or combinations thereof and deposited using PVD, CVD, ALD, or other suitable processes. Although not explicitly shown, the source/drain contact openings 232 may be lined with a barrier layer to isolate the source/drain contacts 236 from the first and second dielectric layers 216 and 220. The barrier layer may be formed of titanium nitride, tantalum nitride, or tungsten nitride. In some embodiments, a planarization process, such as a CMP process, may be performed to remove excess metal and the mask layer 224 from the top surface of the workpiece 200.

Embodiments of the present disclosure provide benefits. For example, by use of the first main etch process 300, the second main etch process 310, the first over-etch process 320, and the second over-etch process 330, methods of the present disclosure form the source/drain contact openings that do not extend below a bottommost surface of the source/drain features 212, thereby reducing the dimensions of the source/drain contact 236 on the X-Z plane. The reduction in dimensions of the source/drain contacts 236 may lead to reduction of parasitic capacitance between gate structures 208 and the source/drain contacts 236. Reference is again made to FIGS. 11 and 12. Each of the gate structures 208 has a topmost surface 208T (shown in FIG. 11) and a bottommost surface 208B (shown in FIG. 12). Each of the source/drain contacts 236 includes a bottommost surface 236B. Each of the source/drain features 212 includes a bottommost surface 212B. For ease of reference, the topmost surface 208T of the gate structure 208 may be referred to as a gate top surface 208T; the bottommost surface 208B of the gate structure 208 may be referred to as a gate bottom surface 208B; the bottommost surface 236B of the source/drain contact 236 may be referred to as a contact bottom surface 236B; and the bottommost surface 212B of the source/drain feature 212 may be referred to as an S/D bottom surface 212B. As illustrated in FIG. 11, the gate top surface 208T is spaced apart from the S/D bottom surface 212B by a first distance d1 and the gate top surface 208T is spaced apart from the contact bottom surface 236B by a second distance d2. The second distance d2 is also illustrated in FIG. 12. As shown in FIG. 12, the gate top surface 208T is spaced apart from the gate bottom surface 208B by a third distance d3. In some embodiments, the contact bottom surface 236B draws near but is not below the S/D bottom surface 212B. In this regard, a ratio of the first distance d1 to the second distance d2 is between about 1.0 and about 1.1. In some implementations, the contact bottom surface 236B is above the gate bottom surface 208B. In this regard, a ratio of the second distance d2 to the third distance d3 is between about 0.7 and about 0.8. Because the contact bottom surface 236B does not extend as deep into the first dielectric layer 216 as the gate bottom surface 208B, the parasitic capacitance between the source/drain contacts 236 and the gate structures 208 may be reduced. Additionally, FIGS. 11 and 12 show that the gate bottom surface 208B is closer to the substrate 202 than the contact bottom surface 236B.

As described above in conjunction with FIG. 3, the workpiece 200 may include the first air gap 221, the second air gap 222, and the third air gap 223 disposed in the first dielectric layer 216. In some embodiments, the source/drain contacts 236 may be elongated along the X direction to be in contact with more than one source/drain features 212 arranged in the X direction. In those embodiments, the source/drain contact 236 is shared by more than one source/drain features 212 or more than one transistors. As a result, the source/drain contacts 236 may span over more than source/drain features on different fin-shaped structures 204 or extends over an isolation structure 217. When conventional source/drain contact opening formation techniques are used, the source/drain contact openings may extend through and merge with air gaps present in the first dielectric layer 216. In embodiments of the present disclosure, the source/drain contact openings 232 may merge with the third air gap 223 but fall short of reaching the first air gap 221 and the second air gap 222. As shown in FIG. 12, the resulting source/drain contact 236 may fill the source/drain contact opening 232 and the third air gap 223 while the first air gap 221 and the second air gap 222 remain close to the source/drain contacts 236. The source/drain contacts 236 of the present disclosure do not extend downward into the ESL 214 disposed on the isolation feature 206. Attention is first directed to FIG. 11. There, the contact bottom surface 236B terminates within the first dielectric layer 216 between two fin-shaped structures 204 and does not extend into a portion of the ESL 214 on the isolation feature 206. Similarly, as shown in FIG. 12, in the isolation regions 30, the contact bottom surface 236B terminates within the first dielectric layer 216 and does not extend into the portion of the ESL 214 on the isolation feature 206. Both FIGS. 11 and 12 show that the source/drain contacts 236 of the present disclosure do not extend into the isolation feature 206.

In one exemplary aspect, the present disclosure is directed to a semiconductor device. The semiconductor device includes a first fin-shaped structure extending lengthwise along a first direction over a substrate, a first epitaxial feature over a source/drain region of the first fin-shaped structure, a gate structure disposed over a channel region of the first fin-shaped structure and extending along a second direction perpendicular to the first direction, and a source/drain contact over the first epitaxial feature. A bottommost surface of the gate structure is closer to the substrate than a bottommost surface of the source/drain contact. In some embodiments, the gate structure further includes a topmost surface away from the substrate. The gate structure includes a first depth toward the substrate as measured from the topmost surface of the gate structure, the source/drain contact includes a second depth toward the substrate as measured from the topmost surface of the gate structure, and a ratio of the second depth to the first depth is between 0.7 and about 0.8. In some embodiments, the gate structure further includes a topmost surface away from the substrate, the source/drain contact includes a first bottommost surface toward the substrate, the first epitaxial feature includes a second bottommost surface toward the substrate, and a ratio of a first distance between the topmost surface and the first bottommost surface to a second distance between the topmost surface and the second bottommost surface is between about 1.0 and about 1.1. In some implementations, the semiconductor device may further include a second fin-shaped structure aligned lengthwise with the first fin-shaped structure along the first direction, an isolation feature disposed between the first fin-shaped structure and the second fin-shaped structure along the first direction, a dielectric layer over the isolation feature, a second source/drain contact disposed in the dielectric layer, and a first air gap disposed in the dielectric layer. The first air gap is disposed vertically between the isolation feature and the second source/drain contact. In some instances, the semiconductor device may further include an etch stop layer disposed between the isolation feature and the dielectric layer. In some instances, the semiconductor device may further include a second air gap disposed in the dielectric layer and directly over the first air gap. The second source/drain contact is exposed into the second air gap. In some embodiments, the semiconductor device may further include a first isolation gate structure disposed partially over an end of the first fin-shaped structure, and a second isolation gate structure disposed partially over an end of the second fin-shaped structure. The dielectric layer and the second source/drain contact are disposed between the first isolation gate structure and the second isolation gate structure.

In another exemplary aspect, the present disclosure is directed to a method. The method includes receiving a workpiece that includes a fin-shaped structure, a gate structure disposed over a channel region of the fin-shaped structure, an epitaxial feature disposed over a source/drain region of the fin-shaped structure, an etch stop layer disposed over the epitaxial feature, and a first dielectric layer over the etch stop layer. The method further includes depositing a capping layer over the workpiece, depositing a second dielectric layer over the capping layer, forming an etch mask over the second dielectric layer, the etch mask having an opening, performing a plurality of main etch processes through the opening of the etch mask to etch through the first dielectric layer, the capping layer, and the second dielectric layer, and performing a plurality of over-etch processes through the opening of the etch mask to etch through the etch stop layer.

In some embodiments, the capping layer is free of oxygen and the etch mask includes tungsten carbide. In some implementations, the plurality of main etch processes includes a first main etch process and a second main etch process. In some embodiments, the first main etch process etches substantially through the second dielectric layer and the second main etch process etches through the capping layer and the first dielectric layer and stops before reaching the etch stop layer. In some implementations, the plurality of over-etch processes includes a first over-etch process and a second over-etch process. In some implementations, the first over-etch process etches through the etch stop layer to expose the epitaxial feature and the second over-etch process further etches back the etch stop layer to further expose the epitaxial feature.

In yet another exemplary aspect, the present disclosure is directed to a method. The method includes receiving a workpiece that includes a fin-shaped structure, a gate structure disposed over a channel region of the fin-shaped structure, an epitaxial feature disposed over a source/drain region of the fin-shaped structure, an etch stop layer disposed over the epitaxial feature, and a first dielectric layer over the etch stop layer. The method further includes depositing a capping layer over the workpiece, depositing a second dielectric layer over the capping layer, forming an etch mask over the second dielectric layer, the etch mask having an opening, performing a first main etch process through the opening of the etch mask to etch through at least a portion of the second dielectric layer, performing a second main etch process through the opening of the etch mask to etch through the capping layer and at least a portion of the first dielectric layer, performing a first over-etch process to expose a first surface of the epitaxial feature, and performing a second over-etch process to recess the epitaxial feature and the etch stop layer to expose a second surface of the epitaxial feature. The second surface is greater than the first surface.

In some embodiments, each of the first main etch process and the second main etch process is a dry etch process, the first main etch process includes use of a fluorine containing etchant, and the second main etch process includes uses of the fluorine containing etchant and a nitrogen-containing reagent. In some embodiments, the fluorine containing etchant includes $CF_4$, $SF_6$, $NF_3$, $CH_2F_2$, $CHF_3$, or $C_2F_6$, and the nitrogen-containing reagent includes nitrogen or ammonia. In some implementations, each of the first main etch process and the second main etch process is a wet etch process, the first main etch process includes use of a dilute hydrofluoric acid (DHF) solution, and the second main etch process includes uses of the DHF and ammonium fluoride. In some embodiments, the first over-etch process has a first etch selectivity for the etch stop layer, the second over-etch process has a second etch selectivity for the etch stop layer, and the first etch selectivity is greater than the second etch selectivity. In some instances, each of the first over-etch process and the second over-etch process is a dry etch process, the first main etch process includes use of a fluorine containing etchant and a nitrogen-containing reagent, and the second main etch process includes uses of the fluorine containing etchant and is free of the nitrogen-containing reagent. In some embodiments, the first over-etch process includes use of a phosphoric acid solution, and the second over-etch process includes use of $CF_4$, $SF_6$, $NF_3$, $CH_2F_2$, $CHF_3$, or $C_2F_6$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first fin structure and a second fin structure arising from a substrate;
   an isolation feature disposed between the first fin structure and the second fin structure;
   a first epitaxial source/drain feature disposed over the first fin structure;
   a second epitaxial source/drain feature disposed over the second fin structure;
   a contact etch stop layer (CESL) disposed over the isolation feature;
   an interlayer dielectric (ILD) layer over the CESL; and
   a source/drain contact extending through the CESL and the ILD layer to electrically couple to first epitaxial source/drain feature and the second epitaxial source/drain feature,
   wherein a portion of the source/drain contact extends between the first epitaxial source/drain feature and the second epitaxial source/drain feature,
   wherein a bottom surface of the first epitaxial source/drain feature is lower than a bottom surface of the portion of the source/drain contact that extends between the first epitaxial source/drain feature and the second epitaxial source/drain feature.

2. The semiconductor structure of claim 1, further comprising:
   a third fin structure arising from the substrate and disposed adjacent the second fin structure; and
   a third epitaxial source/drain feature disposed over the third fin structure,
   wherein the second epitaxial source/drain feature merges with the third epitaxial source/drain feature.

3. The semiconductor structure of claim 1, further comprising:
   a silicide layer sandwiched between the source/drain contact and the first epitaxial source/drain feature and between the source/drain contact and the second epitaxial source/drain feature,
   wherein the source/drain contact is in direct contact with the ILD layer.

4. The semiconductor structure of claim 3, wherein the silicide layer comprises titanium silicide, nickel silicide, cobalt silicide, tantalum silicide, or tungsten silicide.

5. The semiconductor structure of claim 1,
   wherein the source/drain contact further comprises a barrier layer to interface the ILD layer,
   wherein the barrier layer comprises titanium nitride, tantalum nitride, or tungsten nitride.

6. The semiconductor structure of claim 1, further comprising:
   a gate structure disposed over the first fin structure and adjacent the first epitaxial source/drain feature,
   wherein a bottom surface of gate structure is lower than the bottom surface of the source/drain contact.

7. The semiconductor structure of claim 1, further comprising:
a capping layer disposed over the ILD layer; and
a top ILD layer over the capping layer,
wherein the source/drain contact further extends through the top ILD layer and the capping layer.

8. The semiconductor structure of claim 7, wherein the capping layer comprises an oxygen-free dielectric material.

9. The semiconductor structure of claim 1, further comprising:
a gate spacer layer disposed along sidewalls of the first fin structure and the second fin structure,
wherein the CESL is disposed between the gate spacer layer and the ILD layer.

10. A semiconductor device, comprising:
a first fin structure and a second fin structure arising from a substrate;
an isolation feature disposed between the first fin structure and the second fin structure;
a gate spacer layer disposed along a sidewall of the first fin structure and a sidewall of the second fin structure;
a first epitaxial source/drain feature disposed over the first fin structure;
a second epitaxial source/drain feature disposed over the second fin structure;
a contact etch stop layer (CESL) disposed over the isolation feature and along sidewalls of the gate spacer layer;
an interlayer dielectric (ILD) layer over the CESL; and
a source/drain contact extending through the CESL and the ILD layer to electrically couple to first epitaxial source/drain feature and the second epitaxial source/drain feature,
wherein a portion of the source/drain contact extends between the first epitaxial source/drain feature and the second epitaxial source/drain feature,
wherein a bottom surface of the first epitaxial source/drain feature is lower than a bottom surface of the portion of the source/drain contact that extends between the first epitaxial source/drain feature and the second epitaxial source/drain feature.

11. The semiconductor device of claim 10, further comprising:
a silicide layer sandwiched between the source/drain contact and the first epitaxial source/drain feature and between the source/drain contact and the second epitaxial source/drain feature,
wherein the source/drain contact is in direct contact with the ILD layer.

12. The semiconductor device of claim 10, further comprising:
a third fin structure arising from the substrate and disposed adjacent the second fin structure; and
a third epitaxial source/drain feature disposed over the third fin structure,
wherein the second epitaxial source/drain feature merges with the third epitaxial source/drain feature.

13. The semiconductor device of claim 10, wherein the gate spacer comprises silicon oxide, silicon nitride, silicon oxynitride, silicon oxycarbonitride, silicon carbonitride, or silicon carbide.

14. The semiconductor device of claim 10, further comprising:
a gate structure disposed over the first fin structure and adjacent the first epitaxial source/drain feature,
wherein a bottom surface of gate structure is lower than the bottom surface of the source/drain contact.

15. The semiconductor device of claim 10, further comprising:
a capping layer disposed over the ILD layer; and
a top ILD layer over the capping layer,
wherein the source/drain contact further extends through the top ILD layer and the capping layer.

16. The semiconductor structure of claim 7, wherein the capping layer comprises silicon nitride.

17. A device structure, comprising:
a first fin structure, a second fin structure, and a third fin structure arising from a substrate;
an isolation feature disposed between the first fin structure and the second fin structure;
a first epitaxial source/drain feature disposed over the first fin structure;
a second epitaxial source/drain feature disposed over the second fin structure and the third fin structure;
a contact etch stop layer (CESL) disposed over the isolation feature and along sidewalls of the first fin structure, the second fin structure, and the third fin structure;
an interlayer dielectric (ILD) layer over the CESL; and
a source/drain contact extending through the CESL and the ILD layer to electrically couple to first epitaxial source/drain feature and the second epitaxial source/drain feature,
wherein a portion of the source/drain contact extends between the first epitaxial source/drain feature and the second epitaxial source/drain feature.

18. The device structure of claim 17, wherein a bottom surface of the first epitaxial source/drain feature is lower than a bottom surface of the portion of the source/drain contact that extends between the first epitaxial source/drain feature and the second epitaxial source/drain feature.

19. The device structure of claim 17, further comprising:
a gate spacer layer disposed along sidewalls of the first fin structure and the second fin structure,
wherein the CESL is disposed between the gate spacer layer and the ILD layer.

20. The device structure of claim 17, further comprising:
a capping layer disposed over the ILD layer; and
a top ILD layer over the capping layer,
wherein the source/drain contact further extends through the top ILD layer and the capping layer.

* * * * *